United States Patent [19]

Cowley

[11] Patent Number: 4,806,878
[45] Date of Patent: Feb. 21, 1989

[54] PHASE COMPARATOR LOCK DETECT CIRCUIT AND A SYNTHESIZER USING SAME

[75] Inventor: Nicholas P. Cowley, Wroughton, England

[73] Assignee: Plessey Overseas Limited, Essex, England

[21] Appl. No.: 56,476

[22] PCT Filed: Sep. 18, 1986

[86] PCT No.: PCT/GB86/00555

§ 371 Date: Jul. 17, 1987

§ 102(e) Date: Jul. 17, 1987

[87] PCT Pub. No.: WO87/01885

PCT Pub. Date: Mar. 26, 1987

[30] Foreign Application Priority Data

Sep. 18, 1985 [GB] United Kingdom ............... 8522998

[51] Int. Cl.$^4$ .......................... H03L 7/00; H03L 7/06
[52] U.S. Cl. .............................. 331/1 A; 331/DIG. 2
[58] Field of Search ................... 331/1 A, 4, 14, 16, 331/17, 18, 25, 64, DIG. 2; 328/133, 134, 136; 307/525, 526, 527, 528; 375/119, 120

[56] References Cited

U.S. PATENT DOCUMENTS

| | | | |
|---|---|---|---|
| 4,122,405 | 10/1978 | Tietz et al. ........................ | 331/1 A |
| 4,290,029 | 9/1981 | Streckenbach ..................... | 331/1 A |
| 4,437,072 | 3/1984 | Asami ........................... | 331/DIG. 2 |
| 4,473,805 | 9/1984 | Guhn ............................ | 331/1 A |

FOREIGN PATENT DOCUMENTS 0012899 7/1980 .

*Primary Examiner*—Eugene R. Laroche
*Assistant Examiner*—David Mis
*Attorney, Agent, or Firm*—Fleit, Jacobson, Cohn & Price

[57] ABSTRACT

A lock detect circuit (FIG. 3) for use in a synthesiser of the type comprising a phase comparator (5), a reference frequency source (11, 13, 15) a variable frequency oscillator (1), a variable divider (3) and a loop amplifier (7). The circuit includes logic gates (31, 33, . . . 41) to monitor the frequency 'up' and frequency 'down' error signals ($C_U$, $C_D$) produced by the comparator (5) and provides an 'in-lock' indication (S) when frequency 'up' or frequency 'down' signals exclusively are detected in a predetermined period ($D$). Accordingly this circuit may comprise a variable delay (31) an inverter (33) an AND-gate (35) and an OR-gate (39) for generating a comparison signal:

$$f_E = \overline{F}_N \cdot C_D + C_U$$

where $f_N$ is the signal from the inverter time delay pair derived from the divider output. This signal is fed to a series of flip-flops (37) clocked by the frequency down signal. The outputs (Q) of the flip-flops (37) are referred to a second AND-gate (41) to generate the 'in-lock' signal (S).

To accommodate under critical damping a latch (43) may be provided at the signal output. Alternatively two such circuits, one with reversed input connections may be used in tandem to provide both positive to negative detect windows.

9 Claims, 2 Drawing Sheets

PHASE COMPARATOR LOCK DETECT CIRCUIT AND A SYNTHESIZER USING SAME

TECHNICAL FIELD

The present invention concerns improvements in or relating to phase comparator lock detect circuits and synthesisers using the same. More particularly, it relates to an in-phase-lock detect circuit suitable for use in a digital phase-lock-loop synthesiser of the kind which comprises a phase comparator responsive to a reference frequency and to a frequency derived via a variable divider from a variable frequency oscillator (VFO) for providing frequency 'up' and frequency 'down' error signals and a loop amplifier responsive to these error signals and by which means a control signal is fed to the VFO, to control the frequency thereof.

The invention has application to frequency synthesis circuit design in general, and to UHF/VHF heterodyne tuning circuits in particular.

BACKGROUND ART

In television receivers, and the like, it is common practice to employ a digital phase-lock-loop (PLL) frequency synthesiser as part of the front-end tuning circuit. It is a problem, in these receivers, that tuning can be relatively coarse, especially where the implementation is of a low-cost simple construction.

Also due to component drift with ageing the comparison reference frequency may drift or become noisy so causing errors in the synthesised local oscillator frequency.

A further problem arises with these systems when they are used to demodulate r.f. signals from a low quality source, where the actual frequency may be time dependant.

A known improvement upon the aforesaid incorporates a combination of digital and analogue control circuits, employed in tandem. In this arrangement the local oscillator frequency is controlled by a digital P.L.L. until it comes within capture range of the analogue circuit. Subsequently, the variable frequency oscillator is controlled by the latter circuit. A lock detect circuit has been used thus to monitor the performance of the digital PLL and to transfer control to the analogue circuit once 'in-lock' has been attained.

Hitherto, such lock-detect circuits have not been without shortcomings. In particular, such lock detect circuits used in phase comparators can be inherently poor indicators of lock being achieved since in general they:

(i) do not accurately define the lock window;

(ii) in variable reference frequency (f ref) systems the actual lock varies with f ref;

(iii) they are prone to producing spurious 'in-lock' signals when the system is in fact out of lock unless external circuitry (hence extra device pins) is used to correct this fault;

(iv) Analogue lock detect circuits are inherently complex in their operation and also require external components, and, (v) in some digital systems the lock window is highly process dependant.

DISCLOSURE OF THE INVENTION

The present invention is intended to obviate the above shortcomings. It shall prove advantageous in that (i) it has an accurately defined lock window;

(ii) the lock window can be designed to be independant of f ref;

(iii) under normal operating conditions, it can be designed so as not to produce spurious 'in lock' signals;

(iv) it will not require any external circuitry; and (v) the lock window is process independant.

It is observed that in the digital phase-lock-loop synthesiser of the kind aforesaid, when phase-lock condition is obtained, frequency 'down' signals, only, are produced to compensate for leakage current in the loop amplifier and these will be of known magnitude to compensate for leakage current in the loop amplifier. As discussed herein, the frequency 'up' and the frequency 'down' signals are thus monitored by a logic circuit to detect this particular condition and to provide an 'in lock' indication signal.

In accordance with the present invention there is thus provided a phase comparator lock detect circuit, for use in a digital synthesiser of the kind aforesaid, this circuit including logic gates responsive to the frequency 'up' and frequency 'down' signals during a predetermined period derived in dependance upon signal fed to the phase comparator from the variable divider, the gates being arranged for generating an 'in-lock' indication signal when frequency 'up' or frequency 'down' signals exclusively are detected for this predetermined period.

BRIEF INTRODUCTION OF THE DRAWINGS

In the drawings accompanying this specification:

DESCRIPTION OF PREFERRED EMBODIMENTS

So that the present invention may be better understood, embodiments thereof will now be described, with reference to the accompanying drawings. The description that follows is given by way of example only.

Figure 1:
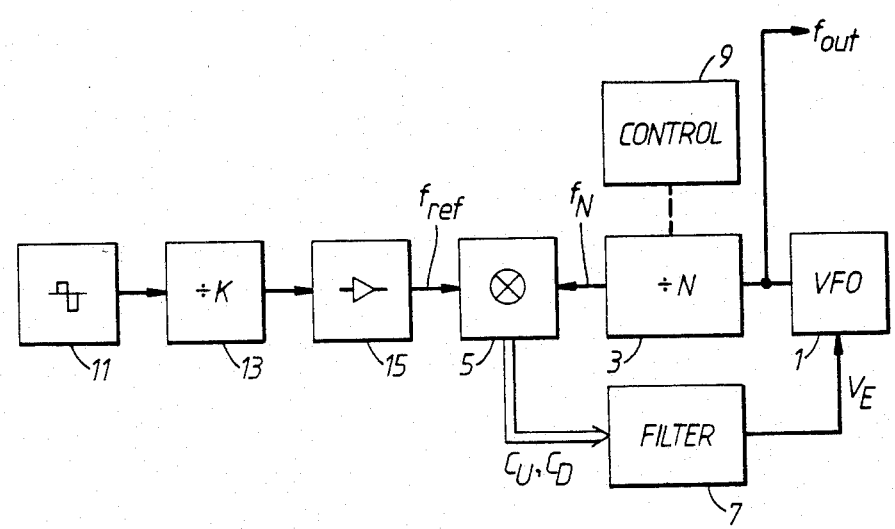
FIG. 1 is a block circuit diagram of a digital phase lock loop frequency synthesiser of known configuration.

A conventional, single loop, digital phase lock loop synthesiser is shown in FIG. 1. The loop consists of a variable frequency oscillator (VFO) 1, a programmable variable-ratio divider 3, a phase comparator 5 and a loop filter 7. The ratio N of the divider 3 is preset by means of a tuning selection control unit 9. The VFO output signal, at frequency $f_{out}$, is divided down and the signal output from the divider 3, at reduced frequency, $f_N$, is compared with a signal of stable reference frequency, $f_{ref}$. This latter is derived from a crystal controlled oscillator 11, a fixed ratio divider 13 and a buffer amplifier 15. Error voltage signal $V_E$ derived from the phase comparator 5, maintains the VFO on frequency.

Figure 2:
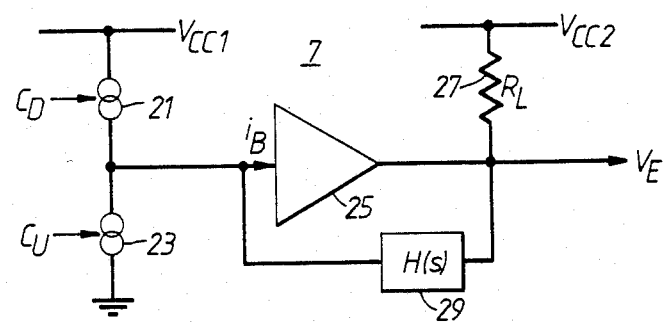
FIG. 2 is a circuit diagram of an active loop filter utilised in the synthesiser above, also of known configuration.

The active loop filter 7 of the synthesiser is shown in detail in FIG. 2. It comprises a pair of current sources, frequency-down and frequency-up current sources, 21 and 23, respectively, connected to the input of a loop amplifier 25. The output of this amplifier 25 is derived across a load impedance 27 ($R_L$) and is fed back to the amplifier input via a filter 20 characterised by its transfer function (H(s)). The output signal $V_E$ of the amplifier 25, is used as error signal for controlling the variable frequency oscillator 1. The latter may be of the voltage controlled kind (VCO), the varactor of which is controlled by the error voltage $V_E$. The current sources 23 and 21, as shown, are controlled by frequency-up and frequency-down signals, $C_U$ and $C_D$, respectively, each provided at corresponding outputs of the phase comparator 5.

When phase-lock is attained, the phase comparator 5 will normally be outputting pulses $C_D$ from the frequency-down output to correct for leakage current $i_B$ in the following loop amplifier 25. The attainment of lock is therefore indicated when frequency-down pulses exclusively are present.

However this condition also exists over a large number of cycles when the varactor tunes from a high to low voltage, therefore the duration of each frequency down pulse must be compared with a lock window time period and should any of the coupled pulses be of longer duration than this lock window period then the loop is deemed to be out of lock.

The subject lock detect circuit (FIG. 3) relies on digital processing of the frequency-up and frequency-down output signals $C_U$, $C_D$ from the phase comparator 5, combined with the phase comparator input signals $f_N$.

The pulse comparator input and output signals, at lock are shown in FIGS. 4(a) to (e). The waveforms as shown are those for:

(a) the divided down signal $f_N$;

(b) a derived signal $f_N'$ corresponding to signal $f_N$ delayed a period $\tau_D$;

(c) the divided down reference signal $f_{ref}$;

(d) the frequency-down pulsed signal $C_D$ where $\tau_E$ is related to $i_B$; and, (e) the frequency-up pulsed signal $C_U$.

As can be seen, over the two reference cycles shown, two frequency-down pulses, each of width $\tau_E$ occur during this period, whilst the frequency-up pulse signal $C_U$ is quiescent.

The divided down signal $f_N$ is passed through a delay unit 31 (FIG. 3) providing the derived signal $f_N'$. After inversion 33, the derived signal $\overline{f_N'}$ is presented to an AND-gate 35 together with the frequency-down signal $C_D$. This provides an error signal $f_E = \overline{f_N'} \cdot C_D$ for subsequent correlation.

Now if $\tau_D = \tau_E$ and, over two $f_{ref}$ cycles, $$\overline{f_N'} \cdot C_D = 0,$$

then the loop can be seen empirically to be 'in-lock'.

Now if $\tau_D = \tau_E$ and, over (K+1)$f_{ref}$ cycles, $$\overline{f_N'} \cdot C_D = 0,$$

then the loop can be deduced to be 'in-lock', and, the lock window defined, has the value $\tau_E$.

Figure 3:
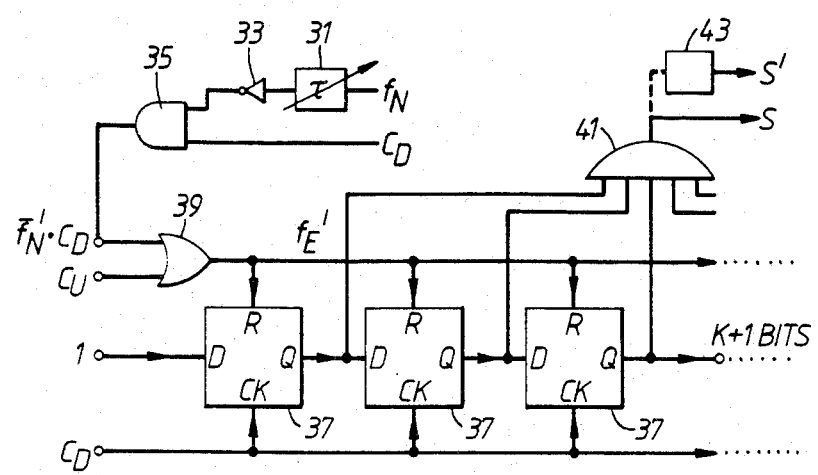
FIG. 3 is a circuit diagram of a phase comparator lock detect circuit, an embodiment of the present invention; and, FIGS. 4 (a) to (e) are pulse waveforms of signals utilised and/or derived in the circuits shown above.
Figure 4:
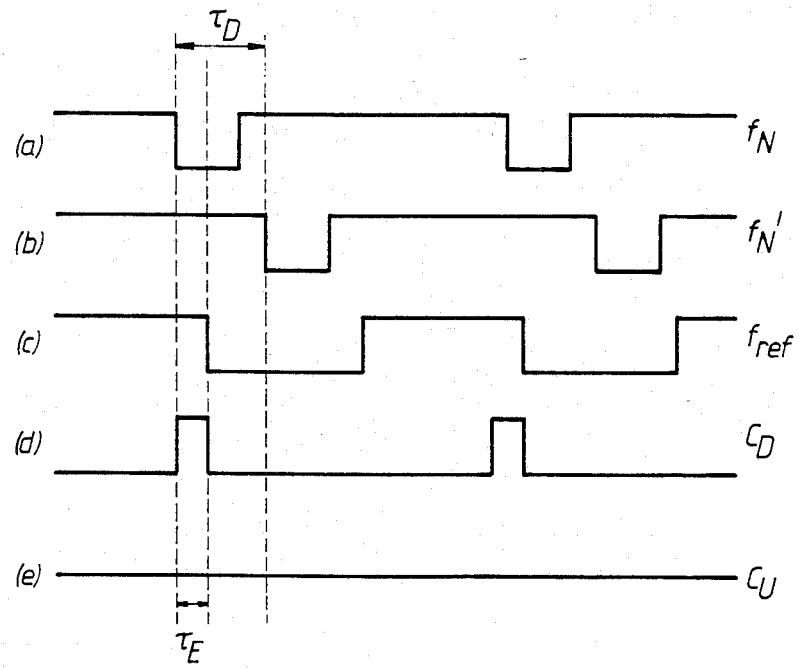

A positive window lock-detect circuit for performing comparison and correlation of the derived error signal $f_E$ and the frequency-up signal $C_U$, and for generating an 'in-lock' indication signal S, is shown in FIG. 3. This circuit comprises a cascade of (K+1) series connected D-type, flip-flops 37, three of which are depicted in the figure. These flip-flops 37 perform correlation over (K+1)$f_{ref}$ cycles, and are all clocked synchronously by means of a common line clock input which receives the frequency-down output signals $C_D$ provided by the phase comparator 5. A common error signal $f'_E$ is applied to the reset ports R of each of the flip-flops 37 and a logic "1" level signal applied to the input port D of the first of the flip-flops 37. This error signal $f'_E$ is derived from the frequency-up signal $C_U$ and the logic derives error signal $f_E = \overline{f_N'} \cdot C_D$ by means of an OR-gate 39:

$$f'_E = \overline{f_N'} \cdot C_D + C_U$$

The output signal from the output port Q of each flip-flop 37 is referred to a common AND-gate 41 so to derive an 'in-lock' indication signal S at the output of this gate 41.

It will be apparent to those of skill in this art that other arrangements of logic components may be utilised to derive the logic functions described above. It is not intended, therefore, that the invention as defined herein be construed to cover only that circuit given here by way of example only.

For any practical system the worst case maximum $i_B$ and hence $\tau E$ can be calculated. Therefore if the loop is critically- or over-damped and the delay $\tau_D$ is chosen to be integer related to $\tau_E$ i.e. $\tau_D = K\tau_E$ and sampling is over (K+1)$f_{ref}$ cycles then it can be seen that the lock detect circuit will only indicate 'in-lock' when steady state condition is reached. Consider thus a circuit using five flip-flops 37 (K=4) and a delay $\tau_d$ digitally defined as $4\tau_E$. The error window thus provided is then $\tau_E$.

However in many applications the loop may be under-damped. In this situation the inserted delay can be modified to give an error window of $n\tau_E$ where n is an integer with coupling over K/$\eta$+1 $f_{ref}$ cycles. The output S of FIG. 3 is then used to set a latched lock window indicator, the latch 43 being reset by a controller when a new frequency is required or loss of signal is sensed. Consider thus the same circuit using five flip-flops 37 (K/$\eta$=4) but with the delay $\tau_D$ now digitally defined as $8\tau_E$. The error window now provided is $2\tau_E$ (K=8,n=2).

The circuit described (FIG. 3) could also be modified to set the in-lock latch by comparing the $C_U$ pulses with a predetermined lock window period over a predetermined number of cycles in a similar manner to that in which the $C_D$ pulses are processed - i.e. to define instead a negative lock window. Thus in FIG. 3 the signals $C_D$, $C_U$ would instead be applied to inputs labelled $C_U$, $C_D$.

The positive and negative window circuits thus can then be combined in tandem—e.g. with OR-gate at their output.

I claim:

1. A phase comparator lock detect circuit for use in a digital phase-lock-loop synthesiser of the kind which comprises:

a phase comparator, responsive to a reference frequency signal and to a divided down signal from a variable divider and a variable frequency oscillator, for providing frequency 'up' and frequency 'down' error signals; and, a loop amplifier responsive to said error signals and by which means a control signal is fed to the variable frequency oscillator to control the frequency thereof;

said lock detect circuit having a plurality of logic gates responsive to the frequency 'up' and frequency 'down' error signals during a predetermined period that is derived in dependence upon the divided down signal, the gates being arranged for generating an 'in-lock' indication signal when frequency 'up' or frequency 'down' signals exclusively are detected for said predetermined period.

2. A circuit, as claimed in claim 1, comprising:
first logic means for deriving a comparison signal from the divided down signal and from the frequency 'up' and frequency 'down' error signals, said comparison signal having a form $f_E$ given by:

$$f_E = \bar{f}'_N \cdot C_1 + C_2 \cdot f_N(t) = f_N(t - \tau_D)$$

where $f_N$ represents the divided down signal, $f'_N$ represents said divided down signal after a time delay $\tau_D$ - a derived signal, $C_1$ corresponds to one of the frequency 'up' and frequency 'down' error signals and $C_2$ corresponds to the other one of the frequency 'up' and frequency 'down' error signals; and, second logic means, responsive to said first logic means and to said one of the frequency 'up' and frequency 'down' error signals, to compare a plurality of time consecutive samples of said comparison signal to derive thereby an 'in-lock' indication signal when frequency 'up' or frequency 'down' signals exclusively are present.

3. A circuit, as claimed in claim 2, comprising:
delay and invert means to invert and apply a selected time delay to the divided down signal;
a first AND-gate connected to the output of the delay and invert means;
an OR-gate connected to the output of said first AND-gate; a plurality of flip-flops connected in series, the clock inputs of these being connected in common, the reset inputs of these being connected to the output of the OR-gate; and,
a second AND-gate connected to the output of each flip-flop to provide at its output the 'in-lock' indication signal.

4. A circuit, as claimed in claim 1, together with a latch connected to the output of the circuit.

5. A combination of two circuits, each a circuit, as claimed in claim 3, the respective OR-gate of each circuit being connected at input to the respective first AND-gates and clock inputs of the flip-flops of the other circuit, said combination serving thus to provide both positive and negative window detection.

6. A digital phase-lock-loop synthesiser comprising;
a source of reference frequency;
a variable frequency oscillator;
a variable divider responsive to said variable frequency oscillator;
a comparator, connected to the source and to the variable divider to provide frequency 'up' and frequency 'down' error signals in response to the reference frequency signal and a divided down signal from the variable divider; and,
a loop amplifier responsive to the frequency 'up' and frequency 'down' error signals and by which means a control signal is fed to said variable frequency oscillator to control the frequency thereof;
said synthesiser having a lock detect circuit comprising:
a plurality of logic gates responsive to the frequency 'up' and frequency 'down' error signals during a predetermined period that is derived in dependence upon the divided down signal fed to the phase comparator from the variable divider, said plurality of logic gates being arranged for generating an 'in-lock' indication signal when frequency 'up' or frequency 'down' signals exclusively are detected for said predetermined period.

7. A synthesiser, as claimed in claim 6, wherein the lock detect circuit comprises:
first logic means for deriving a comparison signal from the divided down signal and from the frequency 'up' and frequency 'down' error signals, said comparison signal having a form $f'_E$ given by:

$$f'_E = \bar{f}_N \cdot C_1 + C_2 \cdot f_N(t) = f_N(t - \tau_D),$$

where $f_N$ represents the divided down signal, $f'_N$ represents said divided down signal after a time delay $\tau_D$ —a derived signal, $C_1$ corresponds to one of the frequency 'up' and frequency 'down' error signals, and, $C_2$ corresponds to the other one of the frequency 'up' and frequency 'down' error signals: and, second logic means, responsive to said first logic means and to said one of the frequency 'up' and frequency 'down' error signals, to compare a plurality of time consecutive samples of said comparison signal to derive thereby an 'in-lock' indication signal when frequency 'up' or frequency 'down' signals exclusively are present.

8. A synthesiser, as claimed in claim 7, wherein $C_1$ corresponds to the frequency 'down' error signal and $C_2$ corresponds to the frequency 'up' error signal.

9. A synthesiser, as claimed in claim 8, wherein the lock detect circuit comprises:
delay and invert means to invert and apply a selected time delay to the derived frequency signal;
a first AND-gate connected to the output of the delay and invert means;
an OR-gate connected to the output of said first AND-gate;
a plurality of flip-flops connected in series, the clock inputs of these being connected in common, the reset inputs of these being connected to the output of the OR-gate; and,
a second AND-gate connected to the output of each flip-flop, to provide at its output an 'in-lock' indication signal.

* * * * *